United States Patent
Huang et al.

(10) Patent No.: US 7,486,938 B2
(45) Date of Patent: Feb. 3, 2009

(54) METHOD AND APPARATUS FOR CONTROLLING A TX POWER AMPLIFIER

(75) Inventors: Shine C. Huang, Yonghe (TW); Ping-Chun Lin, Jhubei (TW)

(73) Assignee: MediaTek Incorporation (TW)

(*) Notice: Subject to any disclaimer, the term of this patent is extended or adjusted under 35 U.S.C. 154(b) by 490 days.

(21) Appl. No.: 11/047,032

(22) Filed: Jan. 31, 2005

(65) Prior Publication Data
US 2005/0282508 A1 Dec. 22, 2005

(30) Foreign Application Priority Data
Jun. 18, 2004 (TW) ................ 93117810 A (51) Int. Cl.
*H04B 1/04* (2006.01)
*H01Q 11/12* (2006.01)

(52) U.S. Cl. .............. 455/91; 455/127.1; 455/522

(58) Field of Classification Search ... 455/114.2–115.4, 455/127.1–127.5
See application file for complete search history.

(56) References Cited

U.S. PATENT DOCUMENTS

| | | |
|---|---|---|
| 5,357,513 A | 10/1994 | Kay et al. |
| 5,491,837 A | 2/1996 | Haartsen |
| 5,675,611 A | 10/1997 | Lehtinen et al. |
| 5,809,017 A | 9/1998 | Smith et al. |
| 5,854,784 A | 12/1998 | Solve et al. |
| 5,970,406 A | 10/1999 | Komara |
| 6,002,673 A | 12/1999 | Kahn et al. |
| 6,044,069 A | 3/2000 | Wan |
| 6,072,788 A | 6/2000 | Peterson et al. |
| 6,072,792 A | 6/2000 | Mazur et al. |
| 6,084,868 A | 7/2000 | Piirainen |
| 6,101,171 A | 8/2000 | Yoshida et al. |
| 6,314,081 B1 | 11/2001 | Chennakeshu et al. |
| 6,430,402 B1 | 8/2002 | Agahi-Kesheh |
| 6,442,146 B1 | 8/2002 | Onodera et al. |
| 6,463,073 B1 | 10/2002 | Bontu et al. |
| 6,490,261 B1 | 12/2002 | Dent et al. |
| 6,529,494 B1 * | 3/2003 | Ostman et al. ............ 370/337 |
| 6,563,884 B1 | 5/2003 | Nikula |
| 6,667,965 B1 | 12/2003 | Yamaura et al. |
| 6,680,920 B1 | 1/2004 | Wan |

(Continued)

FOREIGN PATENT DOCUMENTS

CN 1592121 A 3/2005

(Continued)

*Primary Examiner*—Simon D Nguyen
(74) *Attorney, Agent, or Firm*—Andrew D. Fortney (57) ABSTRACT

A method and an apparatus for controlling a TX power amplifier are provided in the present invention. The invention is applied for generating a power control curve in a power variation area to control the power variation for signal transmission when the TX power amplifier transmits the data during two continuous time slots, which are a first time slot and a second time slot, respectively have a first transmission power value K1 and a second transmission power value K2. The invention is aimed at producing a concave inter-ramp control curve in a inter-ramp division of the power variation area for controlling the power variation of the TX power amplifier, where the power for signal transmission is transformed from the first transmission power value K1 to the second transmission power value K2.

37 Claims, 8 Drawing Sheets

U.S. PATENT DOCUMENTS

| | | |
|---|---|---|
| 6,842,438 B1 | 1/2005 | Benedict et al. |
| 7,010,057 B2 * | 3/2006 | Vayrynen et al. ............ 375/295 |
| 7,146,142 B1 | 12/2006 | Raaf |
| 7,257,096 B2 | 8/2007 | Kim |
| 2003/0114124 A1 | 6/2003 | Higuchi |
| 2003/0160654 A1 | 8/2003 | Fischer et al. |
| 2003/0198300 A1 | 10/2003 | Matero et al. |
| 2004/0038701 A1 * | 2/2004 | Lin ........................... 455/522 |
| 2004/0208157 A1 | 10/2004 | Sander et al. |
| 2004/0266369 A1 * | 12/2004 | McCallister ............. 455/115.1 |
| 2005/0018780 A1 * | 1/2005 | Kim ........................... 375/259 |
| 2005/0054308 A1 | 3/2005 | Vayrynen et al. |
| 2005/0266811 A1 * | 12/2005 | Weiss ..................... 455/127.1 |
| 2006/0189285 A1 | 8/2006 | Takano et al. |
| 2007/0129096 A1 | 6/2007 | Okumura et al. |

FOREIGN PATENT DOCUMENTS

| | | |
|---|---|---|
| WO | WO 97/23062 | 6/1997 |

* cited by examiner

METHOD AND APPARATUS FOR CONTROLLING A TX POWER AMPLIFIER

This application claims the benefit of Taiwan application Serial No. 93117810, filed Jun. 18, 2004, the subject matter of which is incorporated herein by reference.

BACKGROUND OF THE INVENTION

1. Field of the Invention

The invention relates in general to a method and an apparatus for controlling a TX power amplifier, and more particularly to a method and an apparatus for controlling a TX power amplifier applied in a wireless communication system.

2. Description of the Related Art

A wireless communication system is used for transmitting data through the air to a remote end. The TX power amplifier (TX PA) amplifies the power of signals in order to prevent signals from being weakened to be indistinguishable noise before the signals reach the target remote end. Generally speaking, the power of the TX PA for signal transmission is increased to a predetermined amplitude before the signal transmission. The process of power increment occurs in a ramp-up division. After the signal transmission, the power of the TX PA for signal transmission is decreased to a minimum amplitude. The process of power decrement occurs in a ramp-down division.

The Time Division Multiple Access (TDMA) system takes one time slot as a unit for transmitting/receiving data. Any two cellular phones will not transmit data in the same time slot (namely, the same time, the same frequency) so as to avoid interferences. Further, the rear portion of a time slot and the front portion of a subsequent times lot are defined as a guard area, and no data transmission occurs in the guard area so as to avoid interferences. Moreover, data for multiple time slots can be continuously transmitted in the TDMA system, and the transmission power for each of the time slots may be varied. When the TDMA system continuously transmits data for multiple time slots, it has to perform the power transformation in the guard area between two continuous time slots. The process of power transformation occurs in an inter-ramp division.

No matter the power amplitudes for two continuous time slots S1 and S2 are progressively increasing, progressively decreasing, or constant, in the TDMA system, the power control curve, representing the power variation of the conventional TX power amplifier for signal transmission, is linear in the ramp-up division, ramp-down division, and inter-ramp division.

Figure 1A:
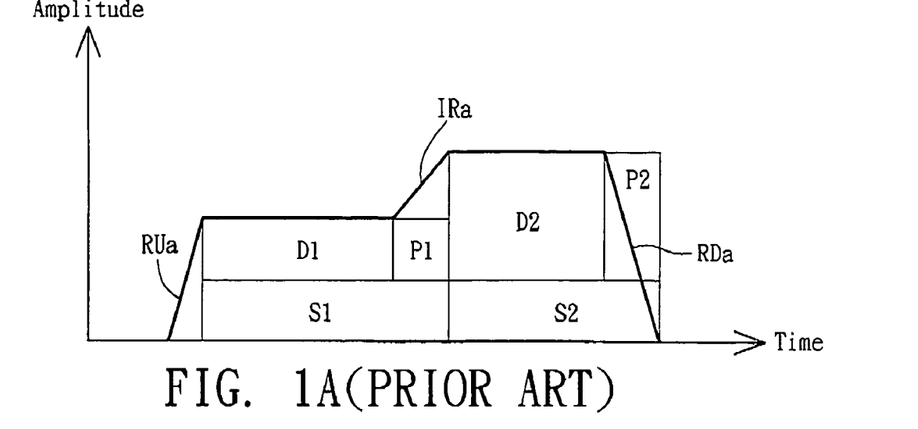
FIGS. 1A-1C (Prior Art) are timing charts showing the variation of the power amplitude of a conventional TX power amplifier when continuously transmitting data of two time slots in the TDMA system.
Figure 1B:
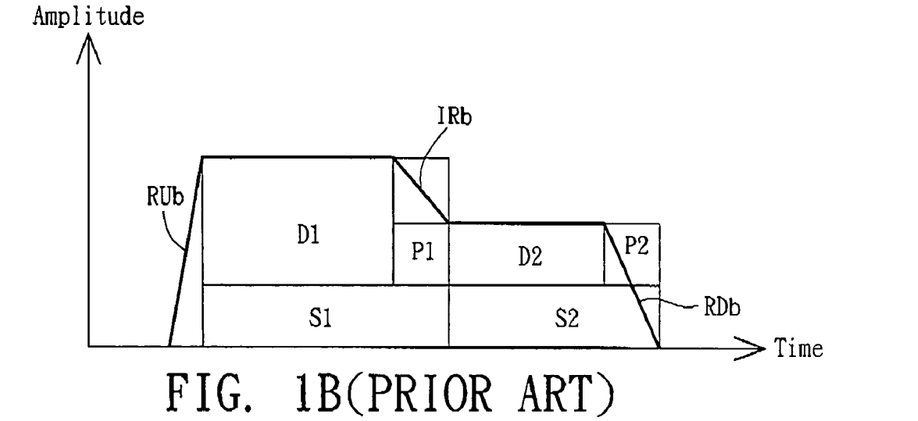
Figure 1C:
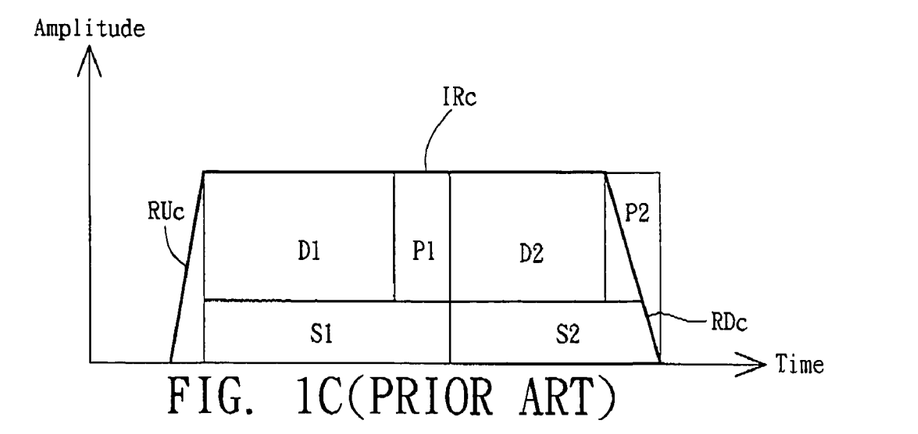

Referring to FIGS. 1A to 1C, the timing charts show the variation of power amplitude of a conventional TX power amplifier for signal transmission when continuously transmitting data for two time slots in the TDMA system. As shown in FIG. 1A, the power amplitudes for two continuous time slots S1 and S2 are progressively increased. The inter-ramp control curve IRa is a linear increasing line, and the power amplitudes in the inter-ramp division are greater than the power amplitude of the time slot S1 and less than the power amplitude of the time slot S2. As shown in FIG. 1B, the power amplitudes for two continuous time slots S1 and S2 are progressively decreased. The inter-ramp control curve IRb is a linear decreasing line, and the power amplitudes in the inter-ramp division are less than the power amplitude of the time slot S1 and greater than the power amplitude of the time slot S2. As shown in FIG. 1C, the power amplitudes for two continuous time slots S1 and S2 are constant. The inter-ramp control curve IRc is a horizontal line, and the power amplitudes in the inter-ramp division are the same as the power amplitudes of the time slot S1 and S2. Furthermore, the ramp-up control curve RUa, RUb and RUc are linear increasing lines while the ramp-down control curve RDa, RDb and RDc are linear decreasing lines.

Conventionally, for the ramp-up and ramp-down divisions, the TDMA system has to store the ramp-up control curves and ramp-down control curves corresponding to various power amplitudes in the memory, requiring a large memory space, and applies linear operations for generating inter-ramp control curves for the TX PA. Because the ramp-up control curves and ramp-down control curves are stored in the memory, the conventional approach is able to rapidly generate a power control curve by accessing the memory, but it takes large memory to store a large amount of ramp-up control curves and ramp-down control curves. For the inter-ramp division, because there are many possible combinations of power amplitudes for two continuous time slots, there are too many inter-ramp control curves to store in the memory. Furthermore, in consideration of the operational complexity, the conventional approach generates the inter-ramp control curves for the TX PA by applying simple linear operations.

However, a very large proportion of the power consumption for the whole system is generally resulted from the power consumption of the TX PA. In particular, the larger the signal transmission power is, the larger the power consumption is. In the design of linear connection of two continuous time slots, even though the TX PA does not transmit any data in the inter-ramp division, it still consumes a lot of power.

SUMMARY OF THE INVENTION

It is therefore an object of the invention to provide a method and an apparatus for controlling a TX power amplifier. Saving power is achieved by reducing the power amplitude in the guard area. Besides, it requires less memory space for storing and less time for calculating and generating a TX PA power control curve.

The invention achieves the above-identified object by providing a power controlling method, which is applied to a TX power amplifier for controlling power of a signal to-be-transmitted. The method produces a power control curve in a power variation area, having at least one transmission power value K, to control the power variation of the signal. The method includes the following steps. An original curve is first generated according to the transmission power value K, and the original curve is horizontally and equally divided into an original left section FL and an original right section FR. Then, a lowest power value H of the power variation area is determined according to the transmission power value K. A left section ratio SL and a right section ratio SR are determined according to the transmission power value K and the lowest power value H. Besides, a left section FL' of the power control curve is calculated and generated according to the lowest power value H, the original left section FL and the left section ratio SL while a right section FR' of the power control curve is calculated and generated according to the lowest power value H, the original right section FR and the right section ratio SR. Lastly, the power control curve in the power variation area is produced according to the left section FL' and the right section FR' so as to control the power variation of the signal.

The invention achieves the above-identified object by further providing a power controlling apparatus, installed in a wireless communication apparatus, for producing a power control curve in a power variation area, having at least one transmission power value K, to control the power variation of the signal. The apparatus includes a power amplifier and a memory. The power amplifier adjust power of a signal to-be-transmitted according to the power control curve. The memory includes an original left section table, an original right section table, a lowest power value table, a left section ratio table, and a right section ratio table. The original left section table stores several original left sections, each of which corresponds to one transmission power value. The original right section table stores several original right sections, each of which corresponds to one transmission power value. The lowest power value table stores several lowest power values, each of which corresponds to one transmission power value. The left section ratio table stores several left section ratios, each of which corresponds to one transmission power value and one lowest power value. The right section ratio table stores several right section ratios, each of which corresponds to one transmission power value and one lowest power value. By performing the following, the power control curve is produced. First, an original curve is generated according to the transmission power value, by searching the original left section table and the original right section table to obtain a corresponding original left section and a corresponding original right section so as to produce the original curve. Then, according to the transmit power value K, the lowest power value table is searched to obtain a corresponding lowest power value H of the power variation area. Next, according to the transmission power value K and the lowest power value H, a left section ratio SL and a right section ratio SR are determined by using the left section ratio table and the right section ratio table. Then, according to the lowest power value H, the original left section FL and the left section ratio SL, a left section FL' of the power control curve is calculated and generated, and according to the lowest power value H, the original right section FR and the right section ratio SR, a right section FR' of the power control curve is calculated. Finally, according to the left section FL' and the right section FR', the power control curve is generated in the power variation area for controlling the power variation of the signal.

Other objects, features, and advantages of the invention will become apparent from the following detailed description of the preferred but non-limiting embodiment. The following description is made with reference to the accompanying drawings.

DETAILED DESCRIPTION OF THE INVENTION

The invention is applied to a TX power amplifier for controlling power of a signal to-be-transmitted. The invention is aimed at producing a power control curve in a power variation area for controlling power variation of the signal, thereby reducing the power consumption. The power variation area has at least one transmission power value K and can be divided into a ramp-up division, an inter-ramp division, and a ramp-down division. The power control curve is produced according to the transmission power value K, an original curve, and a lowest power value H. The original curve is generated according to the transmission power value K and is horizontally and equally divided into an original left section FL and an original right section FR. Then, a lowest power value H of the power variation area is determined according to the transmission power value K. A left section ratio SL and a right section ratio SR are determined according to the transmit power value K and the lowest power value H. Besides, a left section FL' of the power control curve is calculated according to the lowest power value H, the original left section FL and the left section ratio SL while a right section FR' of the power control curve is calculated according to the lowest power value H, the original right section FR and the right section ratio SR. Lastly, according to the left section FL' and the right section FR', the power control curve in the power variation area is produced for controlling the power variation of the signal.

Figure 4A:
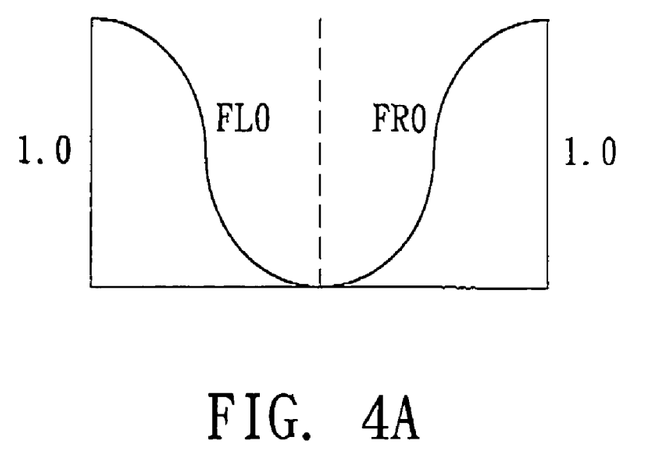
FIG. 4A shows an original inter-ramp curve according to a preferred embodiment of the invention.
Figure 5A:
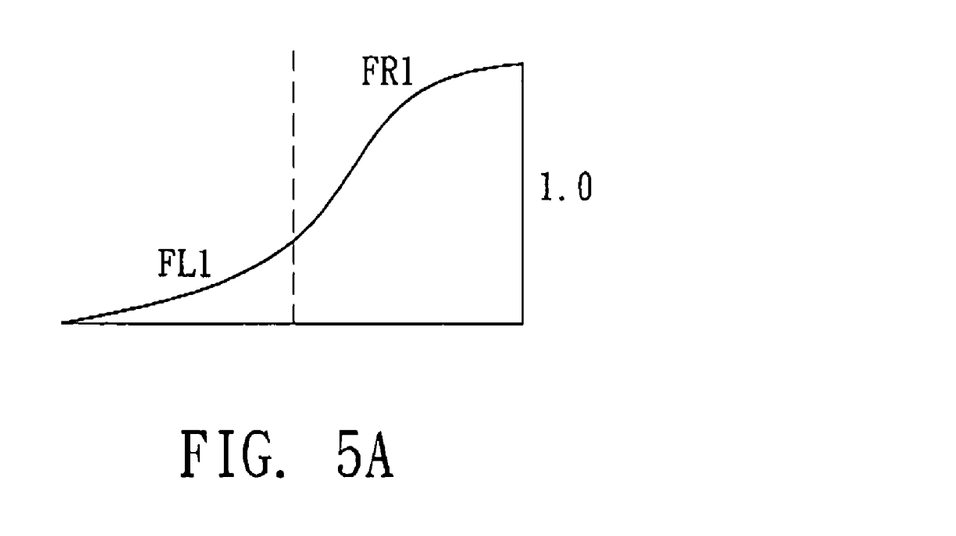
FIG. 5A shows an original ramp-up curve according to a preferred embodiment of the invention.
Figure 6A:
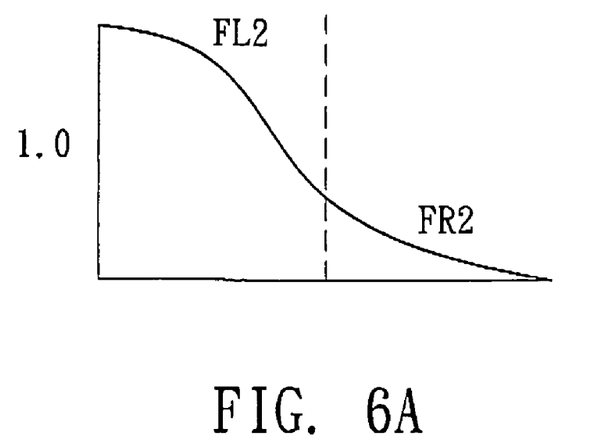
FIG. 6A shows an original ramp-down curve according to a preferred embodiment of the invention.

The power control curve consists of a ramp-up control curve, a ramp-down control curve, and an inter-ramp control curve. The ramp-up control curve corresponds to the ramp-up division of the power control curve, the ramp-down control curve corresponds to the ramp-down division of the power control curve, and the inter-ramp control curve corresponds to the inter-ramp division of the power control curve. In FIG. 5A, a left end of the original left section FL1 of the ramp-up control curve is a lowest point thereof, and a right end of the original right section FR1 of the ramp-up control curve is a highest point thereof. Besides, the original left section FL1 is connected with the original right section FR1. In FIG. 6A, a left end of the original left section FL2 of the ramp-down control curve is a highest point thereof, and a right end of the original right section FR2 of the ramp-down control curve is a lowest point thereof. Besides, the original left section FL2 is connected with the original right section FR2. In FIG. 4A, a left end and a right end of the original left section FL0 of the inter-ramp control curve are respectively a highest point and a lowest point thereof, and a left end and a right end of the original right section FR0 of the inter-ramp control curve are respectively a lowest point and a highest point thereof.

It is noted that each slot has a data area and a guard area is located between the data areas between two adjacent slots. In some embodiments, the output power curve is formed at the guard area. The feature of the invention employs the special property of no data transmission occurring in the guard area to design the inter-ramp control curve as a concave curve so as to reduce the power amplitude in the guard areas for saving power. The width of the concave curve could be predetermined according to user's needs. Preferably, the width of the concave curve should be less than a quarter of the duration of a slot.

Moreover, it should be further noted that the output concave curve is generated according to a reference power curve (the original curve). The reference power curve could be a polynomial or a cosine function pre-stored in a database. The database may have a table for recording all control information regarding the reference power curve. In some embodiments, the reference power curve could be expressed as $[1+COS(2\pi*n/N)]/2$, where n and N are the control information used to generate the reference power curve. However, the present invention is not limited thereto. Any other concave curve, linear or non-linear, could be the reference power curve in the present invention.

Notwithstanding there are many possible combinations of the power amplitudes for two adjacent time slots and the invention can be applied in the condition that data for any two adjacent time slots is continuously transmitted, the following embodiment directed to the continuous transmission of data for two time slots in a fixed frequency is for further description.

Figure 2:
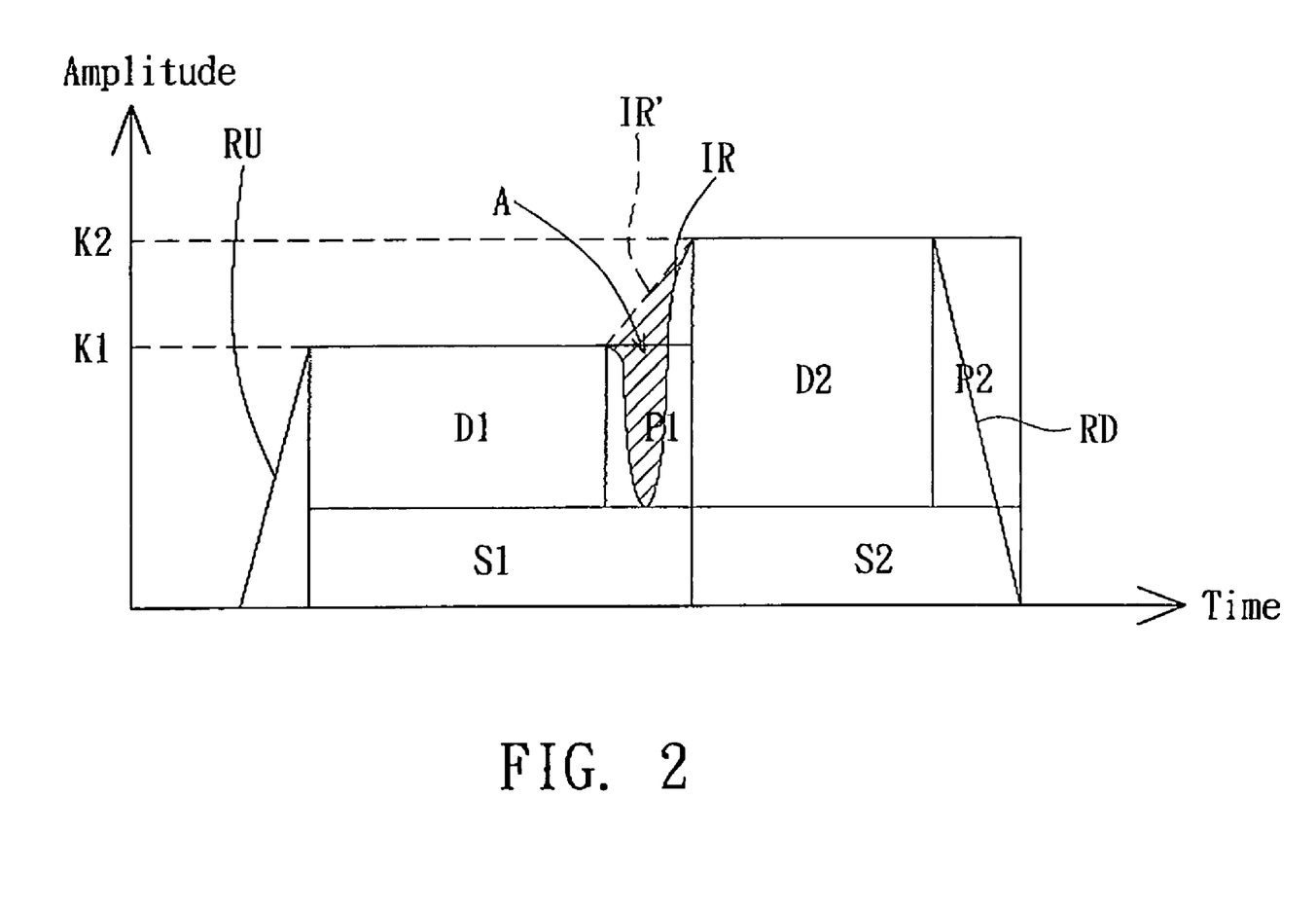
FIG. 2 is a timing chart showing the variation of the power amplitude of a TX power amplifier when continuously transmitting data of two time slots according to a preferred embodiment of the invention.

Referring to FIG. 2, a timing chart showing the variation of the power amplitude of a TX power amplifier when continuously transmitting data of two time slots according to a preferred embodiment of the invention is provided. The rear portions of the two continuous first slot S1 and second slot S2 are respectively set as a first guard area P1 and a second guard area P2, where no data transmission occurs. Specifically, the data transmission only occurs in the first data area D1 and the second data area D2, not in the first guard area P1 and a second guard area P2. The ramp-up control curve RU illustrates that the power of the TX PA for signal transmission is increased from 0 to a first transmission power value K1 before the TX PA transmits signals in the first data area D1. The ramp-down control curve RD illustrates that the power of the TX PA for signal transmission is decreased from the second transmission power value K2 to the minimum amplitude after the TX PA transmits signals in the second data area D2. As for the inter-ramp control curve IR, it illustrates that the power transformation has to occur in the guard area P1, which is positioned between the two continuous time slots, the first time slot S1 and the second time slot S2. The inter-ramp control curve nonlinearly connects the first transmission power value K1 and the second transmission power value K2 for transforming the power of the TX PA for signal transmission. The inter-ramp control curve is formed as a concave curve so as to reduce the power amplitude in the guard area P1 for saving power.

As shown in FIG. 2, the area A surrounded by the inter-ramp control curve IR, having the concave shape, and the inter-ramp control curve IR' of the prior art is the amount of the saved power by applying the present invention, as compared with the conventional TX power amplifier. Besides, no matter the first transmission power value K1 is greater than, equal to, or smaller than the second transmission power value K2, the design of the concave curve according to the invention for reducing the power amplitude in the guard area P1 can effectively save power.

In some embodiments, the method of the present invention of controlling output power of a device in a multi-slot wireless communication system, comprising the following steps of providing a first power value SL at a first time point in a first slot; providing a second power value SR at a second time point in a second slot, wherein the second slot is adjacent to the first slot; providing at least one reference power curve; generating an output power curve according to the reference power curve between the first time point and the second time point, wherein at least one power value Q of the output power curve is substantially less than the first power value SL and the second power value SR; and then adjusting the output power according to the output power curve.

In some embodiments, the reference power curve could include a first power curve FL(t) and a second power curve FR(t) and the output power curve has a first portion FL'(t) and a second portion FR'(t). Here, the output power curve is generated according to the following equation: FL'(t)=H+FL(t)*SL'; and FR'(t)=H +FR(t)*SR', wherein SL'=SL−H and SR'=SR−H, H is a predetermined value. Here, H is the lowest power value of the output power curve. H could be equal to the power value Q. Preferably, the power value Q is approximately 0, or is 6 dB less than the first power value SL and the second power value SR.

It should be noted that the multi-slot wireless communication system could be any TDMA communications, such as GSM, GPRS, EDGE system. The device could be a transmission power amplifier of a mobile phone.

Figure 3:
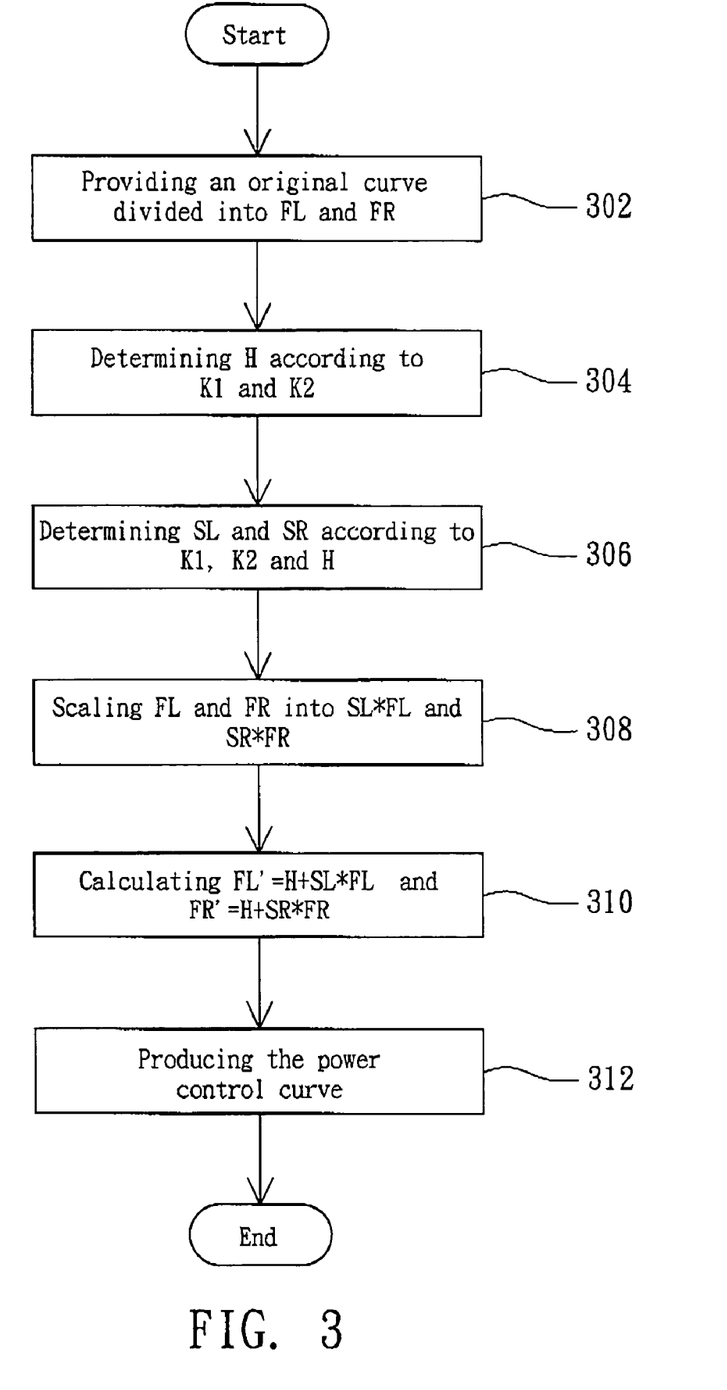
FIG. 3 shows a power controlling method for a TX power amplifier according to a preferred embodiment of the invention.

Referring to FIG. 3, a power controlling method for a TX power amplifier is shown. The TX power amplifier transmits data during two continuous slots with a first transmission power value K1 and a second transmission power value K2 respectively. The method starts with step 302 to provide an original curve. The original curve is horizontally and equally divided into an original left section FL and an original right section FR. Then, at step 304, a lowest power value H of the power variation area is determined according to the first transmission power value K1 and the second transmission power value K2. At step 306, a left section ratio SL and a right section ratio SR are determined according to the first transmission power value K1, the second transmission power value K2 and the lowest power value H. As shown in step 308, the original left section FL is scaled into SL*FL according to the left section ratio SL, and the original right section FR is scaled into SR*FL according to the right section ratio SR. Step 310 calculates a left section FL' and a right section FR' of the power control curve, which satisfy FL'=H+SL*FL and FR'=H+SR*FR. Lastly, at step 312, the power control curve in the power variation area is produced according to the left section FL' and the right section FR'.

In accordance with the above-mentioned steps, the inter-ramp control curve, the ramp-up control curve, and the ramp-down control curve can be respectively generated. In particular, the power controlling method for the power amplifier according to the invention produces a concave inter-ramp control curve for controlling the power variation in the inter-ramp division, making the power amplitude nonlinearly transformed from the first transmission power value K1 to the second transmission power value K2. Further, the ramp-up control curve is produced for controlling the power variation in the ramp-up division, which is progressively increased from the lowest power value H to the first transmission power value K1. In addition, a ramp-down control curve is produced for controlling the power variation in the ramp-down division, which is progressively decreased from the second transmission power value K2 to the lowest power value H.

Figure 4B:
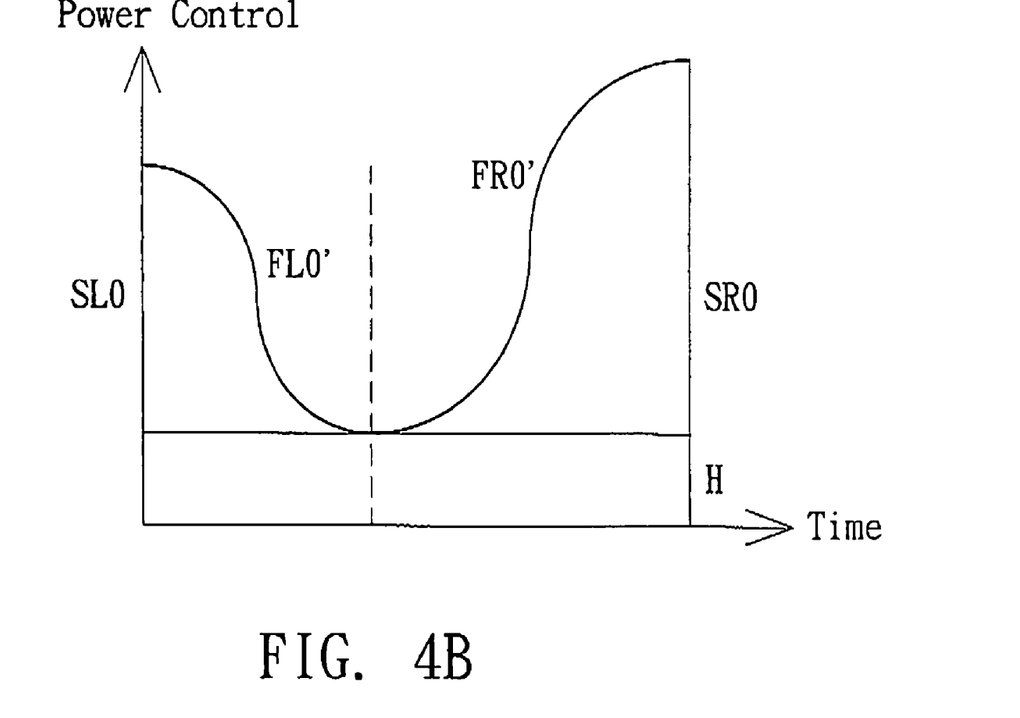
FIG. 4B shows an inter-ramp control curve according to a preferred embodiment of the invention.

Referring to FIGS. 4A and 4B, the original inter-ramp curve and the inter-ramp control curve according to a preferred embodiment of the invention are shown. The inter-ramp control curve is a concave curve and produced by the following steps. The original inter-ramp curve is first provided and is horizontally and equally divided into an original inter-ramp left section FL0 and an original inter-ramp right section FR0. As shown in FIG. 4A, the contours of the original inter-ramp left section FL0 and the original inter-ramp right section FR0 are unnecessary to be symmetric but have to correspond with the standard scopes of time domain and the frequency spectrum in order to avoid interference. The original inter-ramp left section FL0 nonlinearly decreases from a unitary power value to zero and the original inter-ramp right section FR0 nonlinearly increases from zero to the unitary power value. Then, the lowest power value H is determined. According to the first transmission power value K1, the second transmission power value K2 and the lowest power value H, the inter-ramp left section ratio SL0=K1−H and an inter-ramp right section ratio SR0=K2−H are calculated. After that, the original inter-ramp left section FL0 and the original inter-ramp right section FR0 are separately scaled into SL0*FL0 and SR0*FR0. Subsequently, the inter-ramp left section FL0'=H+(SL0/$2^N$)*(FL0*$2^N$) and the inter-ramp right section FR0'=H+(SR0/$2^N$)*(FR0*$2^N$) are calculated. Thus, as shown in FIG. 4B, the inter-ramp control curve having a concave shape is produced, and the power variation of the TX PA in the inter-ramp division can be effectively controlled. The inter-ramp control curve produced by the aforementioned controlling method is continuously connected with the power control curves for the former and the next slots. Besides, the inter-ramp left section FL0' is continuously connected to the inter-ramp right section FR0'.

Figure 5B:
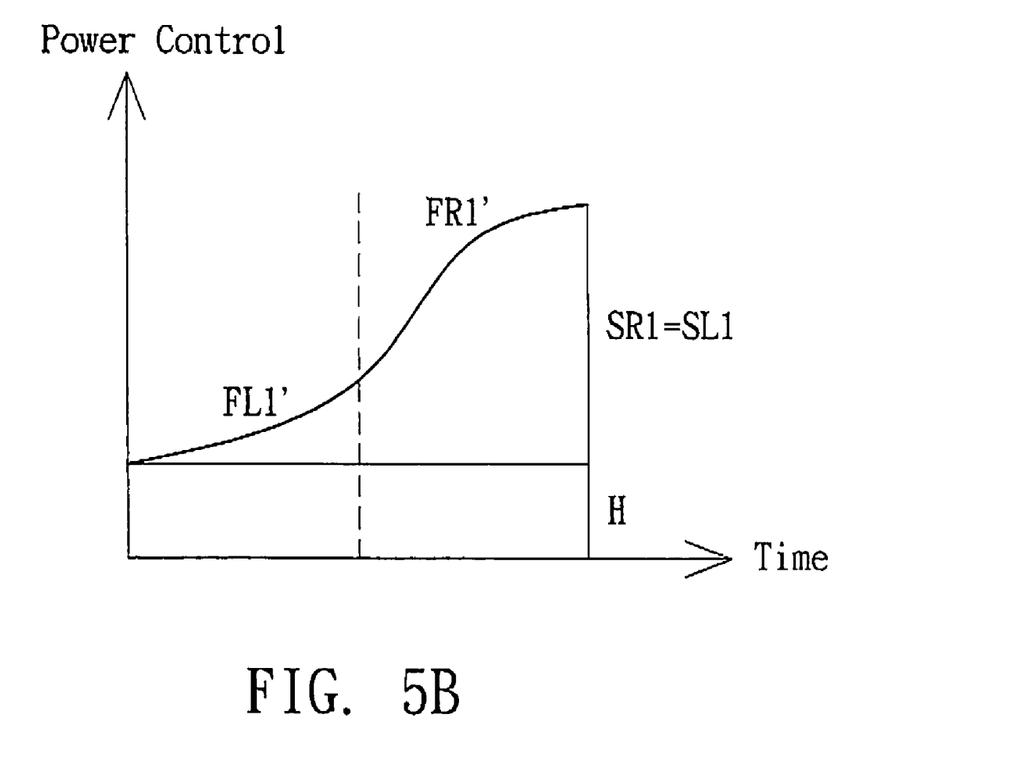
FIG. 5B shows a ramp-up control curve according to a preferred embodiment of the invention.

Referring to FIGS. 5A and 5B, the original ramp-up curve and the ramp-up control curve according to a preferred embodiment of the invention are shown. The ramp-up control curve is produced by the following steps. The original ramp-up curve is provided and is horizontally and equally divided into an original ramp-up left section FL1 and an original ramp-up right section FR1. As shown in FIG. 5A, the contours of the original ramp-up left section FL1 and the original ramp-up right section FR1 are unnecessary to be symmetric but have to correspond with the standard scopes of time domain and the frequency spectrum in order to avoid interference. The original ramp-up left section FL1 nonlinearly increases from zero, and the original ramp-up right section FR1 nonlinearly increases to a unitary power value. Besides, the original ramp-up left section FL1 is continuously connected to the original ramp-up right section FR1. Then, the lowest power value H is determined. According to the first transmission power value K1 and the lowest power value H, the ramp-up left section ratio SL1=K1−H and the ramp-up right section ratio SR1=K1−H are calculated. After that, the original ramp-up left section FL1 and the original ramp-up right section FR1 are scaled into SL1*FL1 and SR1*FR1. Subsequently, the ramp-up left section FL1'=H+(SL1/$2^N$)*(FL1*$2^N$) and the ramp-up right section FR1'=H+(SR1/$2^N$)*(FR1*$2^N$) are calculated. Thus, as shown in FIG. 5B, the nonlinear ramp-up control curve is produced, and the power variation of the TX PA in the ramp-up division can be effectively controlled. The ramp-up control curve produced by the aforementioned controlling method is continuously connected with the power control curve for the next time slot. Besides, the ramp-up left section FL1' is continuously connected to the ramp-up right section FR1'.

Figure 6B:
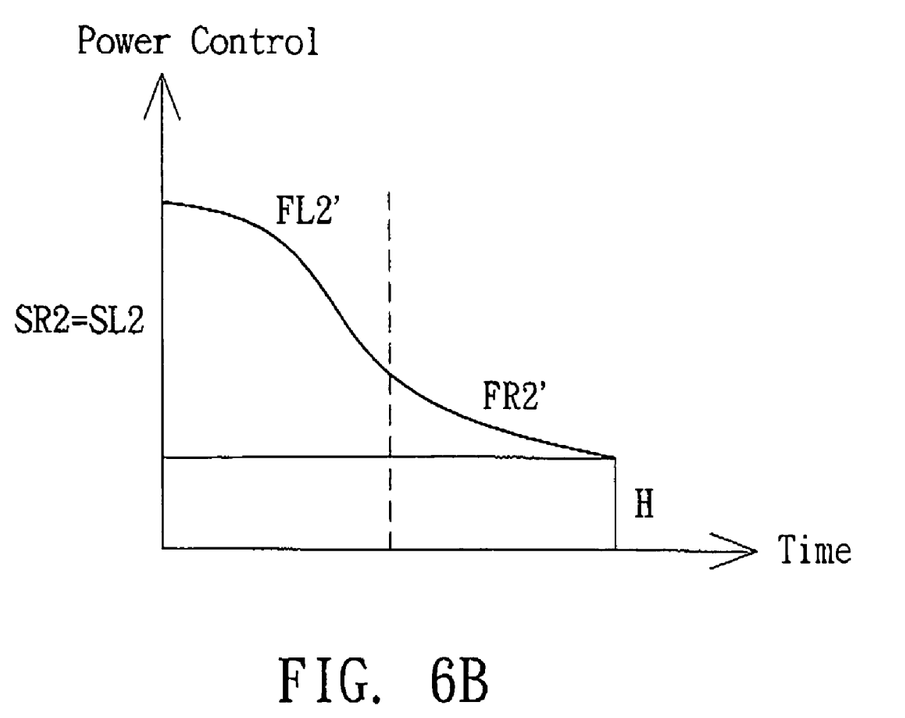
FIG. 6B shows a ramp-down curve according to a preferred embodiment of the invention.

Referring to FIG. 6A and FIG. 6B, the original ramp-down curve and the ramp-down control curve according to a preferred embodiment of the invention are shown. The ramp-down control curve is produced by the following steps. The original ramp-down curve is first provided and is horizontally and equally divided into an original ramp-down left section FL2 and an original ramp-down right section FR2. As shown in FIG. 6A, the contours of the original ramp-down left section FL2 and the original ramp-down right section FR2 are unnecessary to be symmetric but have to correspond with the standard scopes of time domain and the frequency spectrum in order to avoid interference. The original ramp-down left section FL2 nonlinearly decreases from a unitary power value, and the original ramp-down right section FR2 nonlinearly decreases to zero. Then, the lowest power value H is determined. According to the second transmission power value K2 and the lowest power value H, the ramp-down left section ratio SL2=K2−H and the ramp-down right section ratio SR2=K2−H are calculated. After that, the original ramp-down left section FL2 and the original ramp-down right section FR21 are scaled into SL2*FL2 and SR2*FR2. Subsequently, the ramp-down left section FL2'=H+(SL2/$2^N$)*(FL2*$2^N$) and the ramp-down right section FR2'=H+(SR2/$2^N$)*(FR2*$2^N$) are calculated. Thus, as shown in FIG. 6B, the nonlinear ramp-down control curve is produced, and the power variation of the TX PA in the ramp-down division can be effectively controlled. The ramp-down control curve produced by the aforementioned controlling method is continuously connected with the power control curve for the former time slot. Besides, the ramp-down left section FL2' is continuously connected to the ramp-down right section FR2'.

Figure 7:
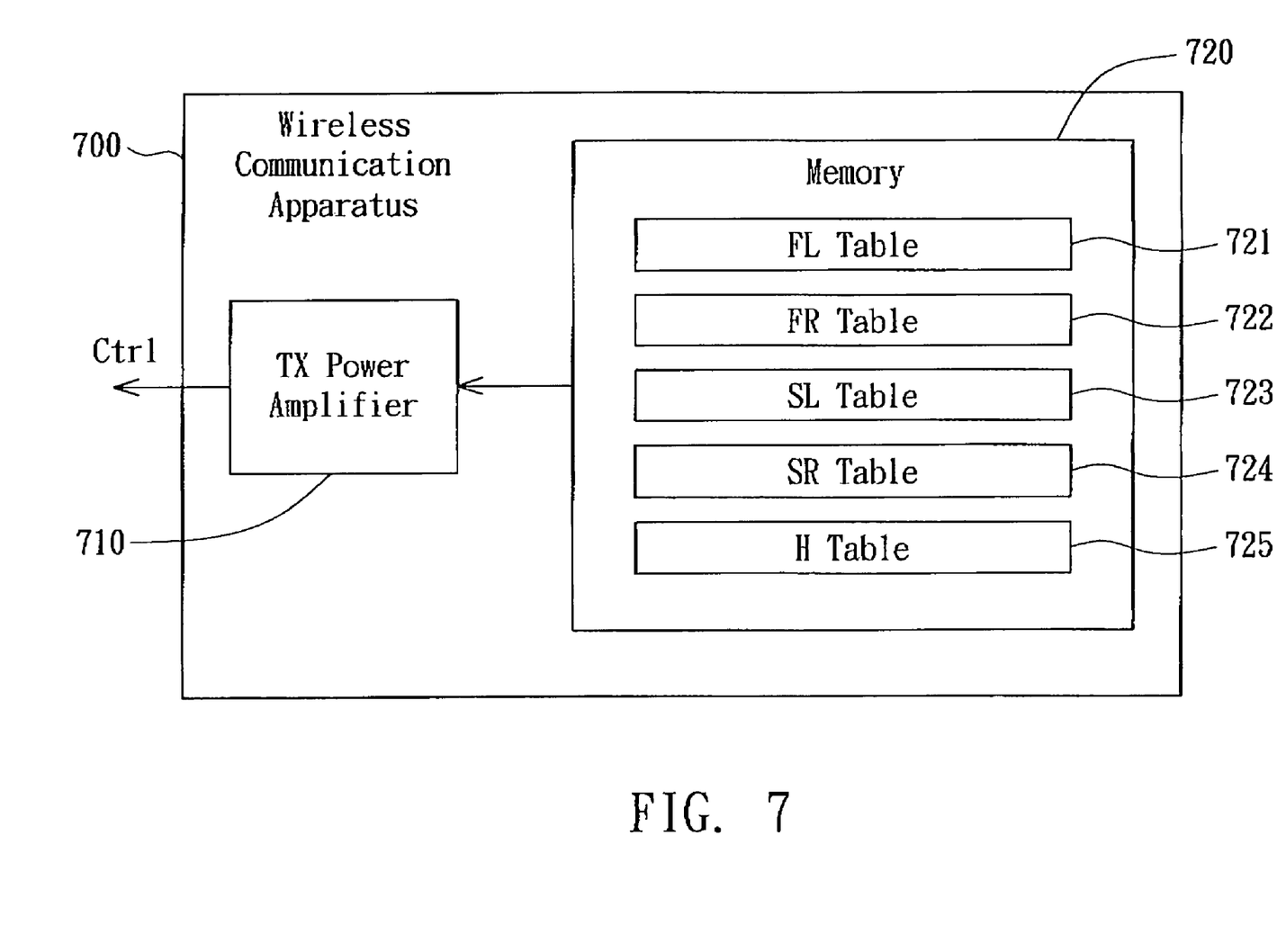
FIG. 7 shows a power controlling apparatus according to a preferred embodiment of the invention.

Referring to FIG. 7, a power controlling apparatus according to a preferred embodiment of the invention is shown. The power controlling apparatus is installed in a wireless communication apparatus, such as a mobile phone, for producing a power control curve in a power variation area to control the power variation of the signal. The apparatus includes a power amplifier 710 and a memory 720. The power amplifier 710 sends a control signal Ctrl according to the power control curve for controlling the power of a signal to-be-transmitted. The memory 720 includes an original left section table (FL table) 721, an original right section table (FR table) 722, a lowest power value table (H table) 725, a left section ratio table (SL table) 723, and a right section ratio table (SR table) 724. The original left section table 721 stores several original left sections, each of which corresponds to one transmission power value. The original right section table 722 stores several original right sections, each of which corresponds to one transmission power value. The lowest power value table 725 stores several lowest power values, each of which corresponds to one transmission power value. The left section ratio table 723 stores several left section ratios, each of which corresponds to one transmission power value and one lowest power value. The right section ratio table 724 stores several right section ratios, each of which corresponds to one transmission power value and one lowest power value.

In practice, the lowest power values H, the left section ratios SL, the right section ratios SR, the original left sections FL, and the original right sections FR corresponding to various power amplitudes are separately stored in several tables. For example, the original left section table 721 for the original left sections FL, the original right section table 722 for the original right sections FR, the lowest power value table 725 for the lowest power values H, the left section ratio table 723 for the left section ratios SL, and the right section ratio table 724 for the right section ratios SR are stored in the memory 720. When different power amplitudes are applied, the system can rapidly obtain the corresponding values by searching the tables.

Regarding the usage of memory, instead of storing various power control curves in the memory in the prior art, , the invention generates power control curves by scaling the original curves to decrease the required memory for storing. Regarding the calculation speed, the original left sections FL and the original right sections FR represented by values with float points will take tens of commands to perform operations, which cause unbearable operation complexity. In order to avoid that, the values stored in the original left section table 721 and the original right section table 722 are separately the products of multiplying the original left sections FL and the original right sections FR by the nth power of 2. That is to say, the values stored in the original left section table 721 and the original right section table 722 respectively satisfy FL_TABLE=FL*$2^N$ and FR_TABLE=FR*$2^N$. Therefore, the power controlling method searches the original left section table and the original right section table according to the transmission power value of the power variation area so as to obtain the corresponding original left section FL_TABLE and the corresponding original right section FR_TABLE for generating the original curve. When calculating the left section FL' and the right section FR' of the power control curve, the shift operations are performed to simplify the calculations. The calculation formulas include FL'=H+(FL_TABLE*SL) with shifting N bits to the right, namely, FL'=H+(FL*$2^N$)*SL/$2^N$, and FR'=H+(FR_TABLE*SR) with shifting N bits to the right, namely, FR'=H+(FR*$2^N$)*SR/$2^N$. Therefore, the binary shift operations can be applied to perform the multiplying operations for values with float points, which avoid the operation complexity. As compared with the conventional controlling method which performs linear operations for each point of the power control curve, the controlling method according to the invention performs multiplying and shifting operations on the original curve and therefore, is capable of rapidly produce the power control curve. Furthermore, the controlling apparatus according to the invention can use the co-processor for performing the multiplying and shifting operations so as to reduce the operation quantity and time.

The controlling method for the TX power amplifier according to the preferred embodiment of the invention nonlinearly connects the power control curve during the power transformation of the TX PA and forms the power control curve as a concave curve so as to reduce the power amplitude in the guard area for saving power. Further, by applying some specific operations, such as the binary shift operations, the power controlling apparatus according to the invention requires less memory and time to produce the power control curve for the TX PA, which has a specific shape, namely, the concave shape, complying with the standard scopes of time domain and frequency spectrum.

Figure 8:
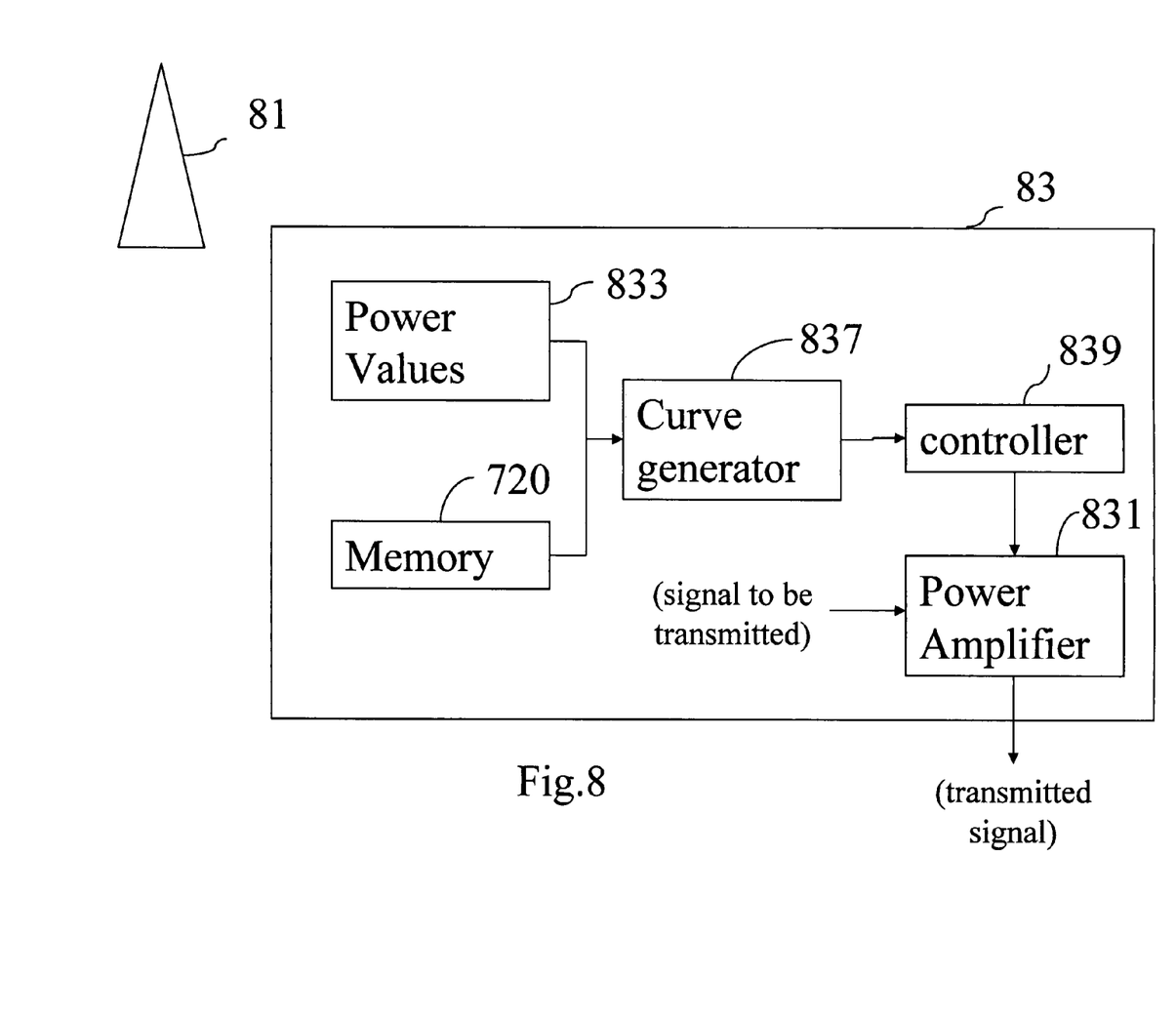
FIG. 8 shows a multi-slot wireless communication system according to an embodiment of the invention.

As shown in FIG. 8, a multi-slot wireless communication system is provided. The system includes a remote end (e.g., base station) 81 and a mobile unit 83. The mobile unit 83 communicates with the base station 81 by a plurality of slots. The mobile unit 83 includes a transmission power amplifier 831; a device 833 for providing a first power value SL at a first time point in a first slot and a second power value SR at a second time point in a second slot, wherein the second slot is adjacent to the first slot; a memory 720 for providing at least one original power curve; a curve generator, 837, receiving power values from device 833 and the original power curve from the memory 720, for generating an output power curve according to the original power curve between the first time point and the second time point, wherein at least one power value Q of the output power curve is substantially less than the first power value SL and the second power value SR; and a controller 839, receiving the output power curve from the curve generator 837 and controlling the transmission power amplifier 831, for adjusting the output power of the transmission power amplifier 831 according to the output power curve.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of controlling output power of a device in a multi-slot wireless communication system, comprising:
providing a first power value at a first time point in a first slot;
providing a second power value at a second time point in a second slot, wherein the second slot is adjacent to the first slot;
determining a first original curve section of an original power curve in accordance with the first slot;
determining a second original curve section of the original power curve in accordance with the second slot;
generating an output power curve according to the original power curve; and
adjusting the output power between the first time point and the second time point according to the output power curve, wherein at least one power value of the output power curve is substantially less than the first power value and the second power value.

2. The method of claim 1, wherein the first slot and the second slot respectively have a data area, a guard area is located between the data area of the first slot and the data area of the second slot, the output power curve is formed at the guard area.

3. The method of claim 1, wherein a difference between the first time point and the second time point is less than a slot time.

4. The method of claim 3, wherein the difference between the first time point and the second time point is less than a quarter of the slot time.

5. The method of claim 1, wherein the output power curve comprises a first portion FL'(t) scaled into SL'*FL(t) and a second portion FR'(t) scaled into SR'*FR(t), wherein FL(t)=the first original curve section, FR(t)=the second original curve section, SL'=the first power value minus H, SR'=the second power value minus H, and H is the lowest power value of the output power curve.

6. The method of claim 5, wherein SL' is a function of $2^{N1}$ and SR'is a function of $2^{N2}$, where N1 and N2 are each a positive integer.

7. The method of claim 1, wherein the at least one power value of the output power curve is approximately 0.

8. The method of claim 1, further comprising:
storing information of the original curve sections in a memory, wherein the information is used to generate the original curve sections.

9. The method of claim 1, wherein the original curve sections comprises polynomial functions.

10. The method of claim 1, wherein the output power curve comprises a concave curve.

11. The method of claim 1, wherein the output power curve comprises a nonlinear concave curve.

12. The method of claim 1, wherein the system comprises a TDMA communication system.

13. The method of claim 1, wherein the first power value in the first slot and the second power value in the second slot are different.

14. The method of claim 1, wherein the original power curve is divided horizontally into an original left section comprising the first original curve section and an original right section comprising the second original curve section.

15. The method of claim 14, wherein the original power curve is divided equally into said original left section and said original right section.

16. The method of claim 1, wherein generating the output power curve comprises:
generating a first portion of the output power curve in accordance with the first original curve section; and
generating a second portion of the output power curve in accordance with the second original curve section.

17. The method of claim 16, wherein:
generating the first portion of the output power curve comprises scaling the first original curve section in accordance with the first power value; and
generating the second portion of the output power curve comprises scaling the second original curve section in accordance with the second power value.

18. The method of claim 16, wherein:
generating the first portion of the output power curve comprises scaling the first original curve section in accordance with the first power value and a lowest power value between the first time point and the second time point; and
generating the second portion of the output power curve comprises scaling the second original curve section in accordance with the second power value and the lowest power value between the first time point and the second time point.

19. An apparatus for controlling output power of a device in a multi-slot wireless communication system, comprising:
a means for providing a first power value at a first time point in a first slot and a second power value at a second time point in a second slot, wherein the second slot is adjacent to the first slot;
a means for determining a first original curve section of an original power curve in accordance with the first slot and for determining a second original curve section of the original power curve in accordance with the second slot;
a means for generating an output power curve in accordance with the original power curve; and
a means for adjusting the output power between the first time point and the second time point according to the output power curve, wherein at least one power value of the output power curve is substantially less than the first power value and the second power value.

20. The apparatus of claim 19, wherein the first slot and the second slot respectively have a data area, a guard area is located between the data area of the first slot and the data area of the second slot, the output power curve is formed at the guard area.

21. The apparatus of claim 19, wherein a difference between the first time point and the second time point is less than a slot time.

22. The apparatus of claim 21, wherein the difference between the first time point and the second time point is less than a quarter of the slot time.

23. The apparatus of claim 19, wherein the output power curve comprises a first portion FL'(t) scaled into SL'*FL(t) and a second portion FR'(t) scaled into SR'*FR(t), wherein FL(t)=the first original curve section, FR(t)=the second original curve section, SL'=the first power value minus H, SR'=the second power value minus H, and H is the lowest power value of the output power curve.

24. The apparatus of claim 23, wherein SL' is a function of $2^{N1}$ and SR' is a function of $2^{N2}$, where N1 and N2 are each a positive integer.

25. The apparatus of claim 19, wherein the at least one power value of the output power curve is approximately 0.

26. The apparatus of claim 19, further comprising:
a means for storing information of the original curve sections in a memory, wherein the information is used to generate the original curve sections.

27. The apparatus of claim 19, wherein the original curve sections comprises polynomial functions.

28. The apparatus of claim 19, wherein the output power curve comprises a concave curve.

29. The apparatus of claim 19, wherein the output power curve comprises a nonlinear concave curve.

30. The apparatus of claim 19, wherein the system comprises a TDMA communication system.

31. The apparatus of claim 19, wherein the first power value in the first slot and the second power value in the second slot are different.

32. The apparatus of claim 19, wherein the device comprises a transmission power amplifier of a mobile phone.

33. The apparatus of claim 19, wherein the apparatus comprises a coprocessor.

34. A mobile phone, comprising the apparatus of claim 19.

35. The apparatus of claim 19, wherein said means for generating the output power curve further comprises comprises:
means for generating a first portion of the output power curve in accordance with the first original curve section; and
means for generating a second portion of the output power curve in accordance with the first original curve section.

36. The apparatus of claim 35, wherein:
said means for generating the first portion of the output power curve comprises means for scaling the first original curve section in accordance with the first power value; and
said means for generating the second portion of the output power curve comprises means for scaling the second original curve section in accordance with the second power value.

37. The apparatus of claim 35, wherein:
said means for generating the first portion of the output power curve comprises means for scaling the first original curve section in accordance with the first power value and a lowest power value between the first time point and the second time point; and
said means for generating the second portion of the output power curve comprises means for scaling the second original curve section in accordance with the second power value and the lowest power value between the first time point and the second time point.

* * * * *